(12) United States Patent
Takamatsu et al.

(10) Patent No.: US 11,493,564 B2
(45) Date of Patent: Nov. 8, 2022

(54) GROUND FAULT DETECTION DEVICE

(71) Applicant: Yazaki Corporation, Tokyo (JP)

(72) Inventors: Hiroaki Takamatsu, Makinohara (JP); Yoshihiro Kawamura, Makinohara (JP); Ryosuke Arigaya, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 32 days.

(21) Appl. No.: 17/088,085

(22) Filed: Nov. 3, 2020

(65) Prior Publication Data

US 2021/0148993 A1 May 20, 2021

(30) Foreign Application Priority Data

Nov. 15, 2019 (JP) ............................. JP2019-207048

(51) Int. Cl.
  *G01R 31/52* (2020.01)
  *G01R 31/12* (2020.01)
(52) U.S. Cl.
  CPC ............. *G01R 31/52* (2020.01); *G01R 31/12* (2013.01)
(58) Field of Classification Search
  CPC .................................. G01R 31/52; G01R 31/12
  See application file for complete search history.

(56) References Cited

U.S. PATENT DOCUMENTS

| | | | |
|---|---|---|---|
| 8,198,902 B2 | 6/2012 | Kawamura | |
| 2007/0210805 A1* | 9/2007 | Kawamura | ............ G01R 31/44 324/541 |
| 2008/0310063 A1* | 12/2008 | Kawamura | ........ G01R 19/0084 361/79 |
| 2011/0006781 A1* | 1/2011 | Kawamura | ............ G01R 31/52 324/551 |
| 2011/0012606 A1* | 1/2011 | Kawamura | ........... B60L 3/0023 324/509 |
| 2012/0153966 A1* | 6/2012 | Kawamura | ............ G01R 31/64 324/548 |
| 2012/0262183 A1* | 10/2012 | Kawamura | ............ G01R 31/52 324/509 |

(Continued)

FOREIGN PATENT DOCUMENTS

| | | |
|---|---|---|
| JP | 2011-17586 A | 1/2011 |
| JP | 2016-161352 A | 9/2016 |

*Primary Examiner* — Patrick Assouad
*Assistant Examiner* — Demetrius R Pretlow
(74) *Attorney, Agent, or Firm* — Sughrue Mion, PLLC

(57) ABSTRACT

A ground fault detection device includes: a capacitor operating as a flying capacitor; a first switching unit for switching between a state in which a positive electrode side of a battery and a first electrode plate of the capacitor are connected via a resistance, and a state in which the first electrode plate of the capacitor is connected to the ground via a measurement resistance; a second switching unit for switching between a state in which a negative electrode side of a high-voltage battery and a second electrode plate of a detection capacitor are connected with a resistance, and a state in which the second electrode plate of the detection capacitor is connected to the ground via the resistance; a control unit for controlling the first switching unit and the second switching unit; and an offset voltage divider circuit that divides and offsets the voltage generated in the measurement resistance.

7 Claims, 13 Drawing Sheets

(56) References Cited

U.S. PATENT DOCUMENTS

| | | | | |
|---|---|---|---|---|
| 2013/0082715 A1* | 4/2013 | Kawamura | ............ | G01R 31/52 |
| | | | | 324/509 |
| 2013/0147491 A1* | 6/2013 | Kawamura | ........... | B60L 3/0069 |
| | | | | 324/509 |
| 2013/0342215 A1* | 12/2013 | Kawamura | ........... | G01R 31/08 |
| | | | | 324/509 |
| 2015/0022219 A1* | 1/2015 | Kawamura | ............ | G01R 31/14 |
| | | | | 324/551 |
| 2015/0285851 A1* | 10/2015 | Kawamura | ........... | B60L 3/0069 |
| | | | | 324/509 |
| 2015/0293167 A1* | 10/2015 | Kawamura | ........... | B60L 3/0069 |
| | | | | 324/551 |
| 2016/0252556 A1 | 9/2016 | Kawanaka et al. | | |

\* cited by examiner

GROUND FAULT DETECTION DEVICE

TECHNICAL FIELD

The present invention relates to a ground fault detection device using a flying capacitor.

BACKGROUND ART

In a vehicle such as a hybrid vehicle including an engine and an electric motor as a drive source, or an electric vehicle, a battery mounted on a vehicle body is charged and electric power supplied from the battery is used to generate a propulsive force. Generally, a battery-related power supply circuit is configured as a high voltage circuit that handles a high voltage of 200 V or higher. In order to ensure safety, the high-voltage circuit including the battery has a non-grounded structure that is electrically insulated from the vehicle body that serves as a ground reference potential point.

Further, there is a vehicle including a booster that boosts a positive potential of a battery and supplies the boosted positive potential of the battery to the load in order to improve drive efficiency of the load. In a vehicle equipped with a booster, the output of the battery, that is, the primary side of the booster, as well as the output of the booster, that is, the secondary side, are electrically isolated from the vehicle body and are ungrounded, and the vehicle is configured so that it is not used as the ground for the battery and booster. Therefore, in a vehicle having a booster, it is necessary to detect the insulation resistance between the secondary side of the booster and the ground as well as the insulation resistance between the battery and the ground in order to monitor the ground fault condition.

Therefore, in order to monitor the ground fault condition between the vehicle and the system provided with the battery and the booster, specifically, the main power supply system from the battery to the load such as the electric motor via the booster and the vehicle body, a ground fault detection device is provided. A method using a capacitor called a flying capacitor is widely used for the ground fault detection device.

FIG. 12 is a block diagram showing a configuration example of a conventional ground fault detection device 500 of the flying capacitor type. The ground fault detection device 500 is a device that is connected to a non-grounded battery B and detects a ground fault in a system including the battery B and the booster 520. The ground fault detection device 500, the booster 520, the load 540, and the like are controlled by an external control device, which is a host device (not shown).

Here, the insulation resistance between the positive electrode on the output side of the battery B, that is, the primary side, and ground is represented by RLp1, and the insulation resistance between the negative electrode and ground is represented by RLn1. Further, the insulation resistance between the output side of the booster 520, that is, the secondary side positive electrode and ground is represented by RLp2, and the insulation resistance between the negative electrode and ground is represented by RLn2. The positive electrode side insulation resistance RLp is a combined resistance of RLp1 and RLp2, and the negative electrode side insulation resistance RLn is a combined resistance of RLn1 and RLn2. Then, the combined resistance of the positive electrode side insulation resistance RLp and the negative electrode side insulation resistance RLn becomes the system insulation resistance RL.

The capacitor C1 functioning as a flying capacitor is charged in a path formed by turning on/off the switches S1 to S4, and the charging voltage is measured by the control device 510.

The Technique for calculating RL is known as a method of obtaining the insulation resistance RL, V0, Vcn, and Vcp are measured, (Vcn+Vcp)/V0 is calculated, and insulation resistance is obtained by referring to table data created in advance based on the obtained calculation value. When the obtained insulation resistance RL is lower than a predetermined reference value, the ground fault detection device 500 determines that a ground fault has occurred and outputs a warning to the external control device.

Here, V0 is a value corresponding to the voltage of the battery B measured on the path formed by turning on the switches S1 and S2. At this time, among the electrode plates of the capacitor C1, the electrode plate connected to the positive electrode side of the battery B is referred to as a first electrode plate, and the electrode plate connected to the negative electrode side of the battery B is referred to as a second electrode plate.

Vcn is a voltage value measured in the charging path by the positive electrode side of the battery B formed by turning on the switch S1 and the switch S4, and is a voltage value including the influence of the negative electrode side insulation resistance RLn. Vcp is a voltage value measured by charging the negative electrode side of the battery B formed by turning on the switches S2 and S3, and is a voltage value including the influence of the positive electrode side insulation resistance RLp.

Generally, in the ground fault determination, V0 measurement, Vcn measurement, V0 measurement, and Vcp measurement are performed as one cycle. At the time of switching each measurement, the charging voltage of the capacitor C1 is read and the capacitor C1 is discharged through a path formed by turning on the switches S3 and S4.

By the way, when the booster 520 is performing the boosting operation and the switch S1 and the switch S4 are turned on to measure Vcn, a voltage obtained by dividing the boosted voltage by the positive side insulation resistance RLp and the negative side insulation resistance RLn is applied to the second electrode plate of the capacitor C1.

When this voltage becomes higher than the voltage applied from the positive electrode side of the battery B, the current sneak causes the capacitor C1 to be charged with a polarity opposite to the normal polarity. That is, the second electrode plate side has a high potential, and the voltage applied to the resistance R3 that is the measurement resistance becomes negative. Since control device 510 generally sets the positive potential as the measurement range, in this case, the voltage measured by control device 510 becomes 0, and the insulation resistance RL cannot be calculated.

In order to solve this problem, Patent Literature 1 discloses a ground fault detection device 600 including a negative potential measurement circuit 620 as shown in FIG. 13. Here, the negative potential measurement circuit 620 includes a diode Da, a resistance Ra, a switch Sa configured by an optical MOS-FET, and a resistance Rb. Further, the ground fault detection device 600 is provided with a switch S5 and a resistance R5.

The ground fault detection device 600 instead of turning on the switch S3 and the switch S4 to charge the capacitor C1 by the A/D1 of the control device 610 when the capacitor C1 is charged with a polarity opposite to the normal when measuring Vcn, turns on the switch S5 and the switch Sa, and the charging voltage of the capacitor C1 is measured by the A/D2 of the control device 610. As a result, the charging voltage of the capacitor C1 charged with the opposite polarity is measured, and the insulation resistance RL can be calculated.

PRIOR ART DOCUMENT

Patent Literature

Patent Literature 1: JP 2011-17586 A

SUMMARY OF THE INVENTION

Technical Problem

In the invention described in Patent Literature 1, by providing the negative potential measuring circuit including the diode, the resistance, and the switch, in the ground fault detection device system including the booster, even when the flying capacitor is charged with reverse polarity, the charging voltage can be measured. However, in the invention described in Patent Literature 1, it is necessary to control the switches S5 and Sa, and the configuration and control are complicated.

Further, in the configuration shown in FIG. 12, if both the switch S1 and the switch S3 are turned on due to a failure or the like, the battery B and the control device 610 are connected without a resistance, and there is a risk that the control device 610 will be exposed to high voltage. Therefore, as in the ground fault detection device 700 shown in FIG. 14, the control device 710 is protected by making the switch S1 and the switch S3 not connected without a resistance. However, in such a ground fault detection device 700, the diode D0 is present. Therefore, current cannot flow from the first plate of the capacitor C1 to the diode D0. Even if the voltage applied to the second plate of the capacitor C1 becomes higher than the voltage applied from the positive electrode side of the battery B, no current flows into the capacitor C1 and the capacitor C1 remains not charged. Therefore, in the ground fault detection device 700 shown in FIG. 14, even if the negative potential measurement circuit as shown in FIG. 13 is added, when the voltage applied to the second plate of the capacitor C1 is higher than the voltage applied from the positive electrode side of the battery B, the insulation resistance RL cannot be calculated.

Therefore, an object of the present invention is to make it possible to easily measure the charging voltage regardless of the charging direction of the flying capacitor.

Solution to Problem

In order to solve the above problems, according to the present invention, there is provided a ground fault detection device that is connected to a non-grounded battery that supplies power to a load via a booster circuit, calculates an insulation resistance of a system provided with the battery, and detects a ground fault, the ground fault detection device including:

a capacitor having a first electrode plate and a second electrode plate and operating as a flying capacitor;

a first switching unit for switching between a state in which a positive electrode side of the battery and the first electrode plate of the capacitor are connected in series via a resistance, and a state in which the first electrode plate of the capacitor is connected to a ground via a measurement resistance;

a second switching unit for switching between a state in which a negative electrode side of the high-voltage battery and the second electrode plate of the capacitor are connected with a resistance, and a state in which the second electrode plate of the capacitor is connected to the ground via the resistance;

a control unit for controlling the first switching unit and the second switching unit; and an offset voltage divider circuit that divides and offsets the voltage generated in the measurement resistance, wherein the control unit has a first port for receiving an input of a voltage generated in the measurement resistance and a second port for receiving an input of a voltage output from the offset voltage divider circuit.

Further, by controlling the first switching unit and the second switching unit, the control unit may switch among a V0 charging path including the battery and the capacitor, a Vcn charging path including the battery, a negative side insulation resistance that is an insulation resistance between the negative electrode side of the battery and the ground, and the capacitor, a Vcp charging path including the battery, a positive side insulation resistance that is an insulation resistance between the positive electrode side of the battery and the ground, and the capacitor, and a charging voltage measurement path including the capacitor and the measurement resistance, and in the charging voltage measurement path, respectively receive inputs of a voltage based on voltage V0 charged in the capacitor in the V0 charging path, a voltage based on voltage Vcn charged in the capacitor in the Vcn charging path, and a voltage based on voltage Vcp charged in the capacitor through the Vcp charging path from the first port and the second port, and when the measured value of the voltage based on the voltage Vcn received from the first port is greater than 0, calculate the insulation resistance from the measured values of the voltage based on the voltage V0, the voltage based on the voltage Vcn, and the voltage based on the voltage Vcp received from the first port.

By controlling the first switching unit and the second switching unit, the control unit may switch among a V0 charging path including the battery and the capacitor, a Vcn charging path including the battery, a negative side insulation resistance that is an insulation resistance between the negative electrode side of the battery and the ground, and the capacitor, a Vcp charging path including the battery, a positive side insulation resistance that is an insulation resistance between the positive electrode side of the battery and the ground, and the capacitor, and a charging voltage measurement path including the capacitor and the measurement resistance, and in the charging voltage measurement path, respectively receive inputs of a voltage based on voltage V0 charged in the capacitor in the V0 charging path, a voltage based on voltage Vcn charged in the capacitor in the Vcn charging path, and a voltage based on voltage Vcp charged in the capacitor through the Vcp charging path from the first port and the second port, and when the measured value of the voltage based on the voltage Vcn received from the first port is greater than 0, calculate the insulation resistance from an average value of the voltage V0 based on the measured value at the first port and the voltage V0 based on the measured value at the second port, an average value of the voltage Vcn based on the measured value at the first port and the voltage Vcn based on the measured value at the second port, and an average value of the voltage Vcp based on the measured value at the first port and the voltage Vcp based on the measured value at the second port.

When the measured value of the voltage based on the voltage Vcn received from the first port is 0, the control unit may calculate the insulation resistance from the measured values of a voltage based on the voltage V0, a voltage based on the voltage Vcn, and a voltage based on the voltage Vcp received from the second port.

When the measured value of the voltage based on the voltage Vcn received from the first port is 0, the control unit may calculate the insulation resistance from the measured values of a voltage based on the voltage V0, and a voltage based on the voltage Vcp received from the first port, and a voltage based on the voltage Vcn received from the second port.

The ground fault detection device may further comprises a port failure occurrence judgment unit for calculating at least one of a difference between voltage V0 based on the measured value at the first port and voltage V0 based on the measured value at the second port, a difference between voltage Vcn based on measurement value at the first port and voltage Vcn based on measurement value at the second port, and a difference between the voltage Vcp based on the measured value at the first port and the voltage Vcp based on the measured value at the second port, and when the calculated difference is equal to or greater than a predetermined threshold value, determines that an abnormality has occurred in at least one of the first port and the second port.

The offset voltage divider circuit may have an input terminal to which the voltage generated in the measurement resistance is input, an output terminal for outputting the output voltage, a first resistance connected between the input terminal and the output terminal, a voltage source that supplies constant voltage, a second resistance having one end connected to the voltage source and another end connected to a line connecting the first resistance and the output terminal, and a third resistance whose one end is grounded and whose other end is connected to a line connecting the first resistance and the output terminal.

Effect of the Invention

According to the present invention, it is possible to easily measure the charging voltage regardless of the charging direction of the flying capacitor.

DESCRIPTION OF EMBODIMENTS

<Ground Fault Detection Device 100>

Figure 1:
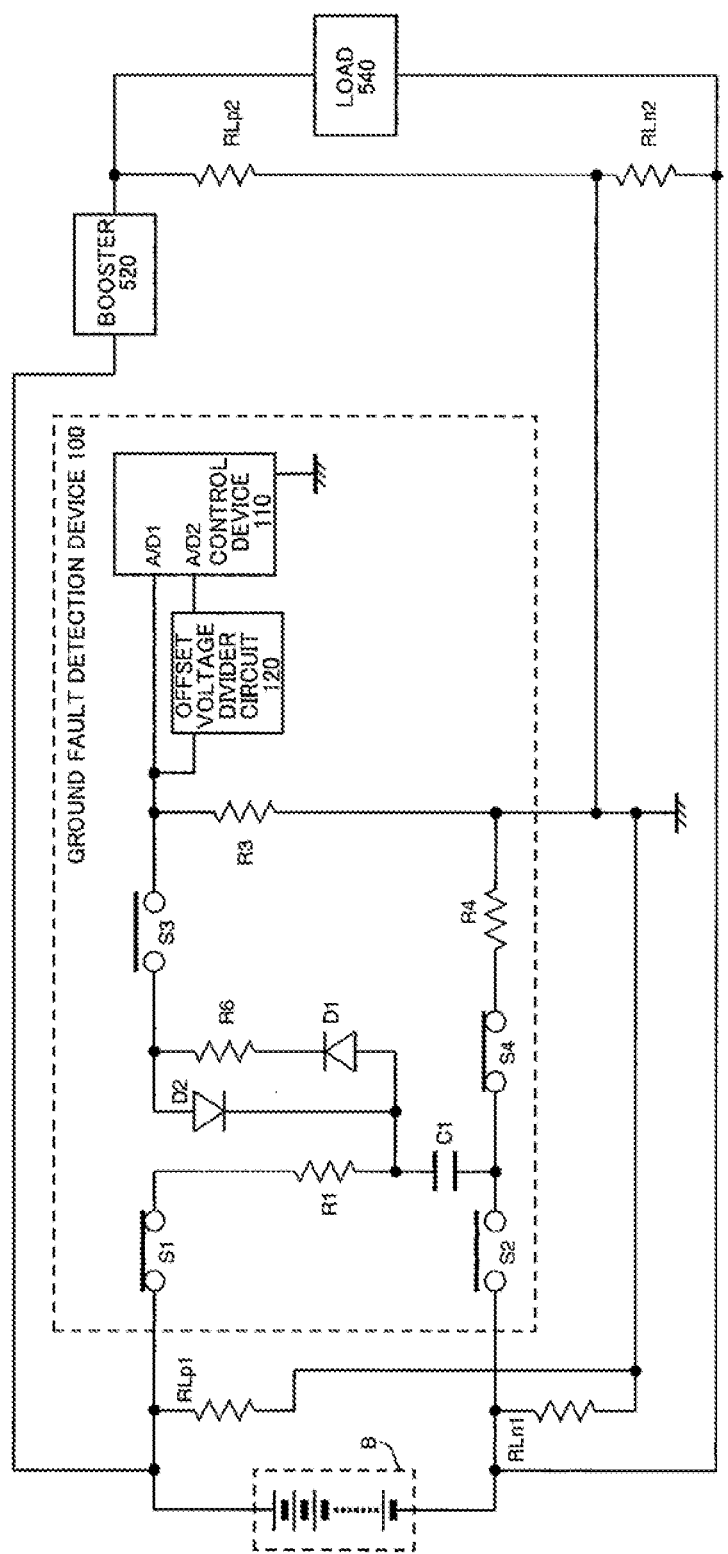
FIG. 1 is a block diagram showing a configuration of a ground fault detection device of the present embodiment.

The ground fault detection device according to an embodiment of the present invention will be described with reference to the drawings. FIG. 1 is a block diagram showing a configuration of a ground fault detection device 100 of the present embodiment. The ground fault detection device 100 is a device that is connected to a non-grounded battery B that supplies power to the load 540 and detects a ground fault in a system provided with the battery B and a booster 520. The ground fault detection device 100, the booster 520, the load 540, and the like are controlled by an external control device which is a higher-level device (not shown).

Here, the insulation resistance between the output side of the battery B, that is, the primary side of the positive electrode and the ground is represented by RLp1, and the insulation resistance between the negative electrode and the ground is represented by RLn1. Further, the insulation resistance between the output side of the booster 520, that is, the secondary side of the positive electrode and the ground is represented by RLp2, and the insulation resistance between the negative electrode and the ground is represented by RLn2. The positive electrode side insulation resistance RLp is the combined resistance of RLp1 and RLp2, and the negative electrode side insulation resistance RLn is the combined resistance of RLn1 and RLn2. Then, the combined resistance of the positive electrode side insulation resistance RLp and the negative electrode side insulation resistance RLn becomes the system insulation resistance RL.

Battery B is composed of a rechargeable battery such as a lithium ion battery. The positive electrode of the battery B is connected to the positive electrode of the load 540 such as an electric motor via the booster 520, and the negative electrode of the battery B is connected to the negative electrode of the load 540.

As shown in this figure, the ground fault detection device 100 includes a capacitor C1 that functions as a flying capacitor.

The ground fault detection device 100 includes four switches S1 to S4 around the capacitor C1 in order to switch the measurement path and control the charging/discharging of the capacitor C1. These switches can be configured with an isolated switching element such as an optical MOS-FET.

Figure 14:
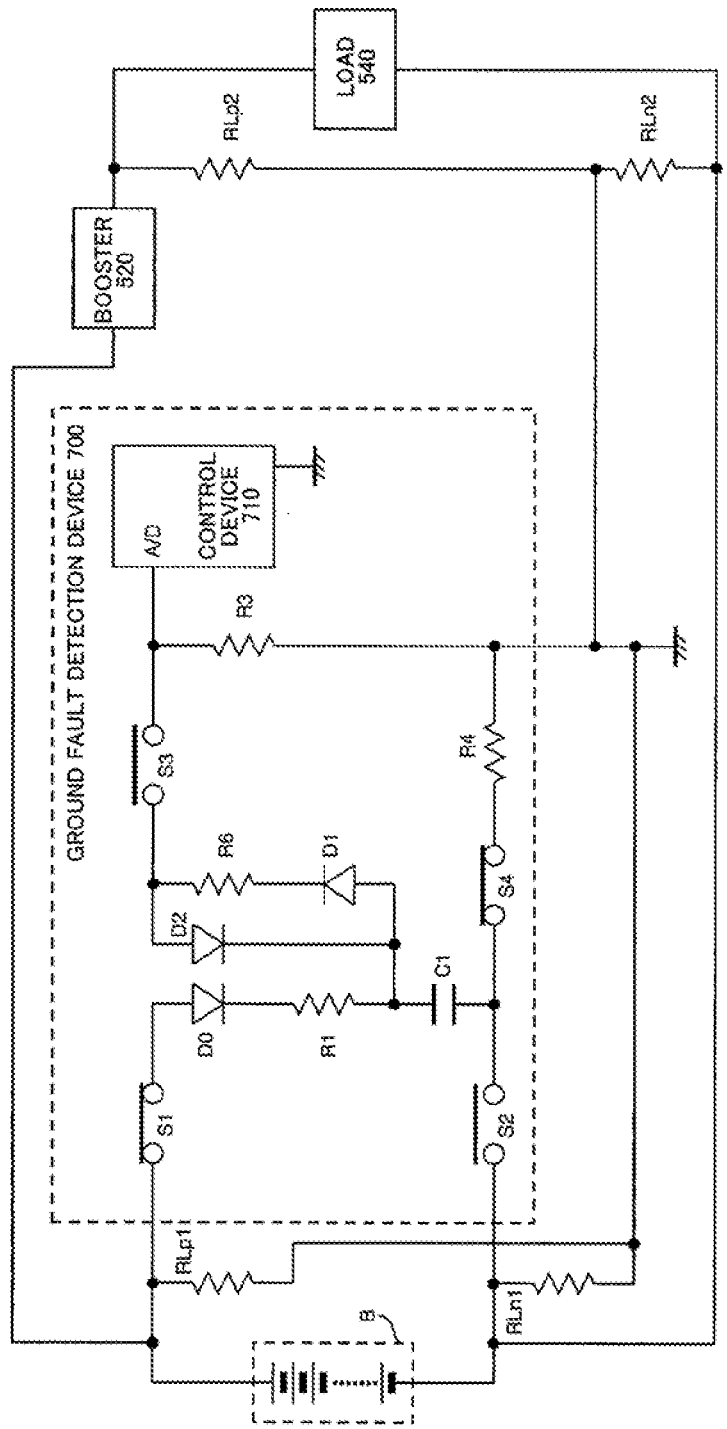
FIG. 14 is a block diagram showing a conventional configuration for protecting a control device from a high voltage.

One end of the switch S1 is connected to the positive electrode of the battery B, and the other end is connected to the resistance R1. The other end of the resistance R1 is connected to the first electrode plate of the capacitor C1. Conventionally, as shown in FIG. 14, a diode in the forward direction from the positive electrode of the battery B to the capacitor C1 is connected between the switch S1 and the resistance R1. However, in this embodiment, this diode is omitted. As a result, in the present embodiment, when the voltage applied to the second electrode plate of the capacitor C1 is larger than the voltage applied from the positive electrode side of the battery B, the capacitor C1 is charged with the opposite polarity to the normal charge.

The first electrode plate of the capacitor C1 is also connected to one end of a parallel circuit of the diode D1 and the diode D2 to which the resistance R6 is connected in series. Here, the diode D1 and the diode D2 are connected so that the forward directions are opposite to each other, and the anode of the diode D1 is connected to the first electrode plate side of the capacitor C1.

The other end of the parallel circuit of the diode D1 and the diode D2 to which the resistance R6 is connected in series is connected to one end of the switch S3, the other end of the switch S3 is connected to the resistance R3, and the other end of the resistance R3 is grounded. Therefore, the voltage of the first plate of the capacitor C1 is divided into the resistance R6 and the resistance R3. In general, since the battery B has a high voltage, the voltage charged in the capacitor C1 also becomes a high voltage. Therefore, in the present embodiment, in order to keep the voltage measured by the control device 110 low, the voltage of the first electrode plate of the capacitor C1 is divided by the resistances R6 and R3. Further, the first A/D port A/D1 of the control device 110 is connected to the line connecting the switch S3 and the resistance R3.

Further, in the present embodiment, in addition to the first A/D port A/D1 of the control device 110, one end of the voltage offset and divider circuit 120 is connected to the line connecting the switch S3 and the resistance R3, and the other end of the circuit 120 is connected to the second A/D port A/D2 of the control device 110. The voltage offset and divider circuit 120 is a circuit that divides and offsets the voltage applied to the resistance R3. That is, the voltage offset and divider circuit 120 divides the voltage $V_{R3}$ applied to the resistance R3 so as to be a times (0<a<1), and offsets (shifts) the voltage by a predetermined voltage b (b>0). In the present embodiment, the voltage ($aV_{R3}$+b) obtained by dividing and offsetting the voltage applied to the resistance R3 is also measured by the control device 110.

One end of the switch S2 is connected to the negative electrode of the battery B, and the other end is connected to the second electrode plate of the capacitor C1. One end of the switch S4 is connected to the second electrode plate of the capacitor C1, and the other end is connected to the resistance R4. The other end of the resistance R4 is grounded.

The control device 110 is composed of a microcomputer or the like, and controls various operations in the ground fault detection device 100 by executing a program incorporated in advance. Specifically, the switches S1 to S4 are individually controlled to switch the measurement path, and the charging and discharging of the capacitor C1 are controlled.

Further, the control device 110 inputs the analog voltage level generated in the resistance R3, which is a measurement resistance, from the first A/D port A/D1. The control device 110 calculates the insulation resistance RL by performing a predetermined calculation based on the measured value. The measurement data of the control device 110, an alarm when a ground fault is detected, and the like are output to the external control device.

The control device 110 measures, for example, a positive predetermined range voltage of 0V to 5V. Therefore, in the conventional ground fault detection device that does not consider that the capacitor C1 is charged in the opposite direction, the values of the resistances R6 and R3 are determined so that the voltage related to the resistance R3 falls within the range of 0 to 5V. If the charging range of the capacitor C1 is 0 to 500V, the values of the resistances R6 and R3 are set so as to divide the voltage by about 1/100.

However, considering that the capacitor C1 is charged in the opposite direction, the charging range of the capacitor C1 is −500 to 500V. At this time, the voltage applied to the resistance R3 is in the range of −5 to 5V, which is wider than the measurement range of the control device 110. When the control device 110 measures a voltage outside the measurement range, the control device 110 outputs 0 as a measured value. Therefore, when the voltage applied to the resistance R3 is in the range of −5V to 0V, the voltage input from the first A/D port A/D1 of the control device 110 is −5V to 0V, and the control device 110 outputs 0 as the measured value. Therefore, the insulation resistance RL cannot be calculated only by the voltage value input from the first A/D port A/D1 of the control device 110.

Therefore, the ground fault detection device 100 of the present embodiment has an offset voltage divider circuit 120 that compresses the voltage range applied to the resistance R3 by dividing it, and further offsets it in the positive direction to output a positive voltage value. The voltage divided and offset by the offset voltage divider circuit 120 is input to the control device 110 from the second A/D port A/D2. Therefore, in the present embodiment, even if the capacitor C1 is charged with the opposite polarity to the normal one, a positive voltage value is input to the control device 110 from the second A/D port A/D2. Therefore, in the present embodiment, even if the capacitor C1 is charged with a polarity opposite to that of the normal one, it is possible to measure the voltage by the control device 110. That is, in the present embodiment, it is possible to measure the charging voltage regardless of the charging direction of the flying capacitor.

For example, if the voltage range applied to the resistance R3 is compressed to ½ to the range of −2.5 to 2.5V, and further offset by 2.5V, the voltage in the range of −5 to 5V applied to the resistance R3 can be measured in the range of 0 to 5V. As will be described later, in order to simplify the circuit configuration, for example, by compressing the voltage range applied to the resistance R3 to ⅖ and offsetting it by 2V, the voltage in the range of −5 to 5V applied to the resistance R3 may be measured in the range of 0 to 4V. Of course, other voltage division ratios and offset amounts corresponding to the charging range of the capacitor C1 and the measuring range of the control device may be used.

Figure 2:
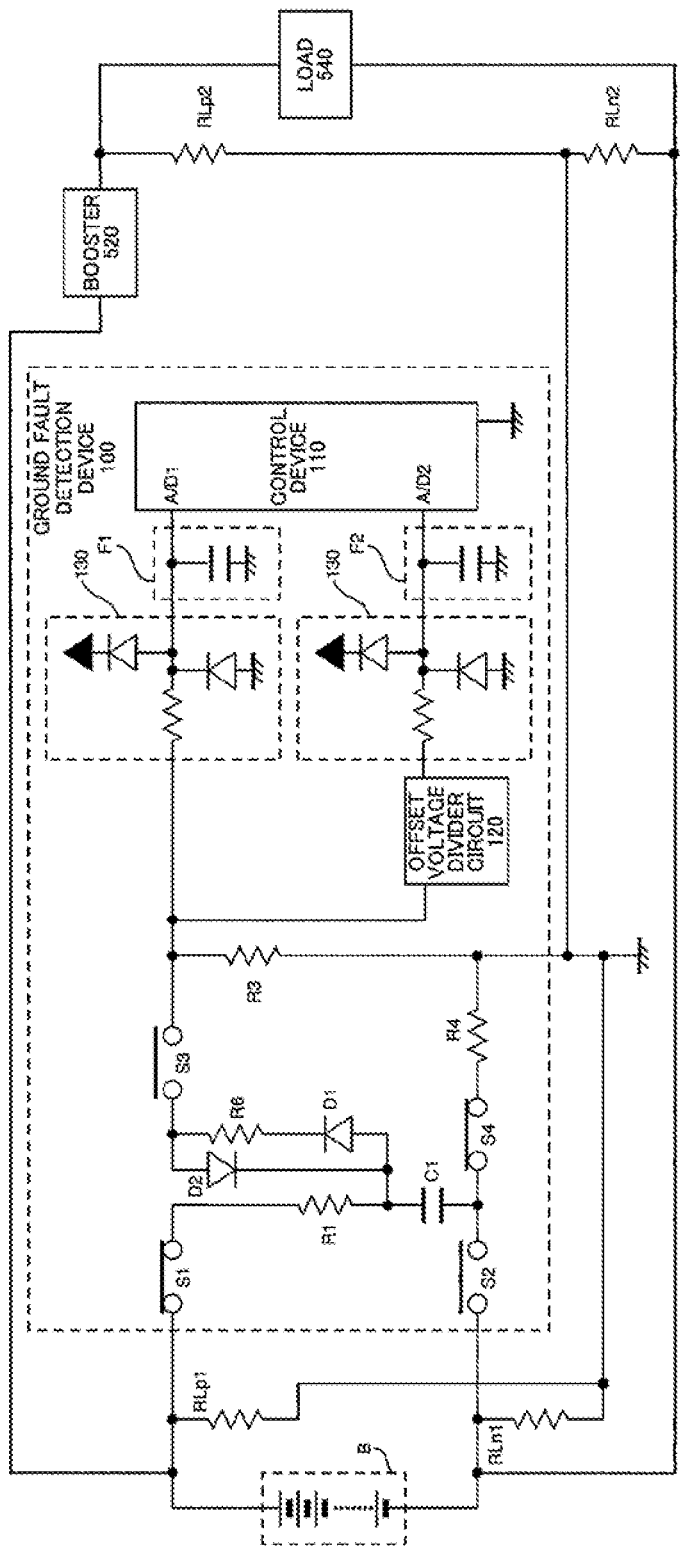
FIG. 2 is a block diagram showing another configuration of the ground fault detection device of the present embodiment.

Further, as shown in FIG. 2, the ground fault detection device 100 may have filters F1 and F2 in order to remove noise. Further, as shown in FIG. 2, in order to protect the control device 110, the ground fault detection device 100 may have a voltage limiting unit 130 that limits the value of the voltage input to the control device 110. As shown in FIG. 2, the voltage limiting unit 130 may be composed of, for example, a resistance, a diode connected to ground, and a diode connected to a voltage source, and may set the voltage of this voltage source to be equal to or lower than the upper limit of the measurement range of the control device 110. By doing so, the voltage within the measurement range is input to the control device 110 regardless of the value of the voltage generated in the measurement resistance R3.

<Operation of Ground Fault Detection Device 100>

Figure 3:
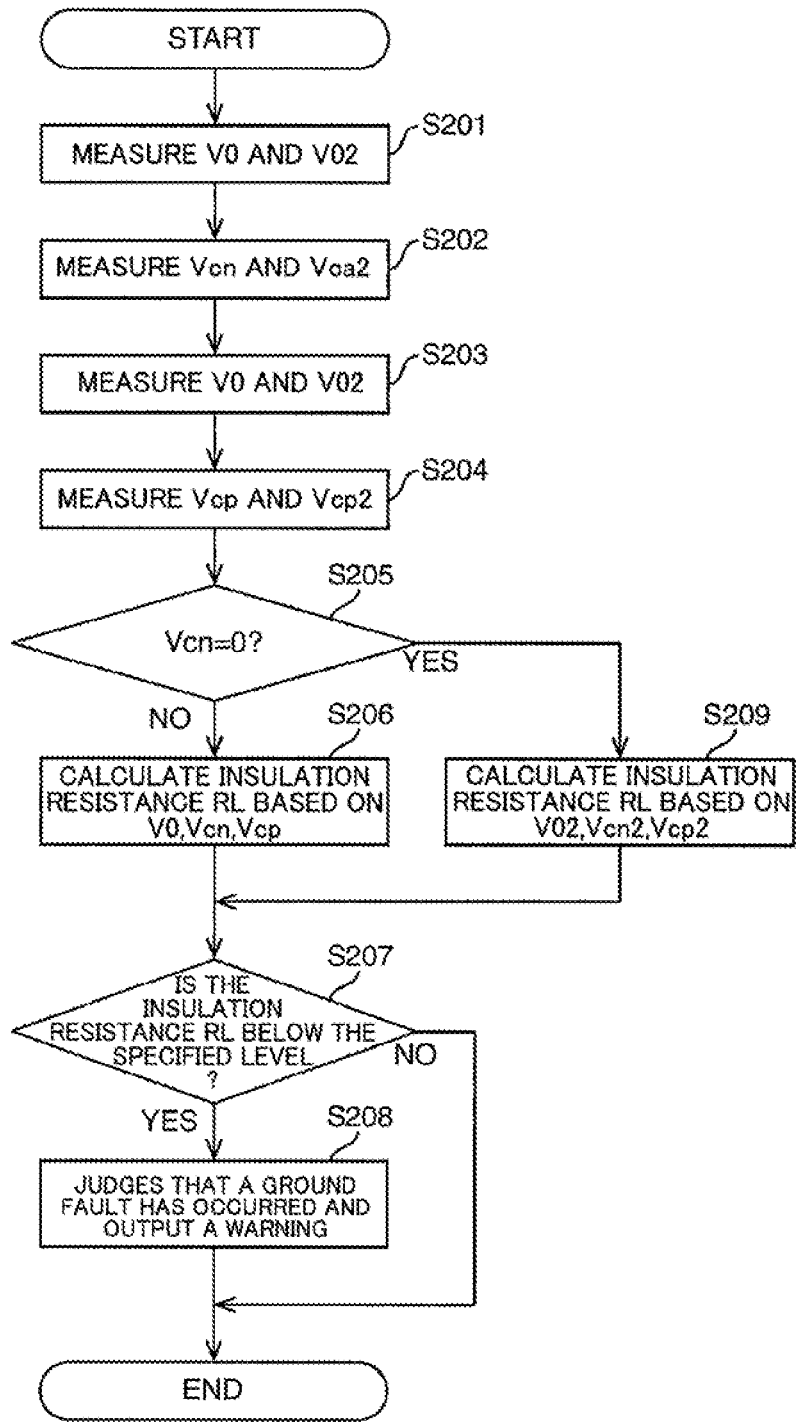
FIG. 3 is a flowchart showing an operation of the ground fault detection device of the present embodiment.

The operation of the ground fault detection device 100 having the above configuration will be described with reference to the flowchart of FIG. 3. The ground fault detection device 100 repeats the measurement operation, for example, with V0 measurement period (step S201), Vcn measurement period (step S202), V0 measurement period (step S203), Vcp measurement period (step S204), the insulation resistance RL calculation and the ground fault determination (steps S205 to S209) as one cycle.

Figure 4:
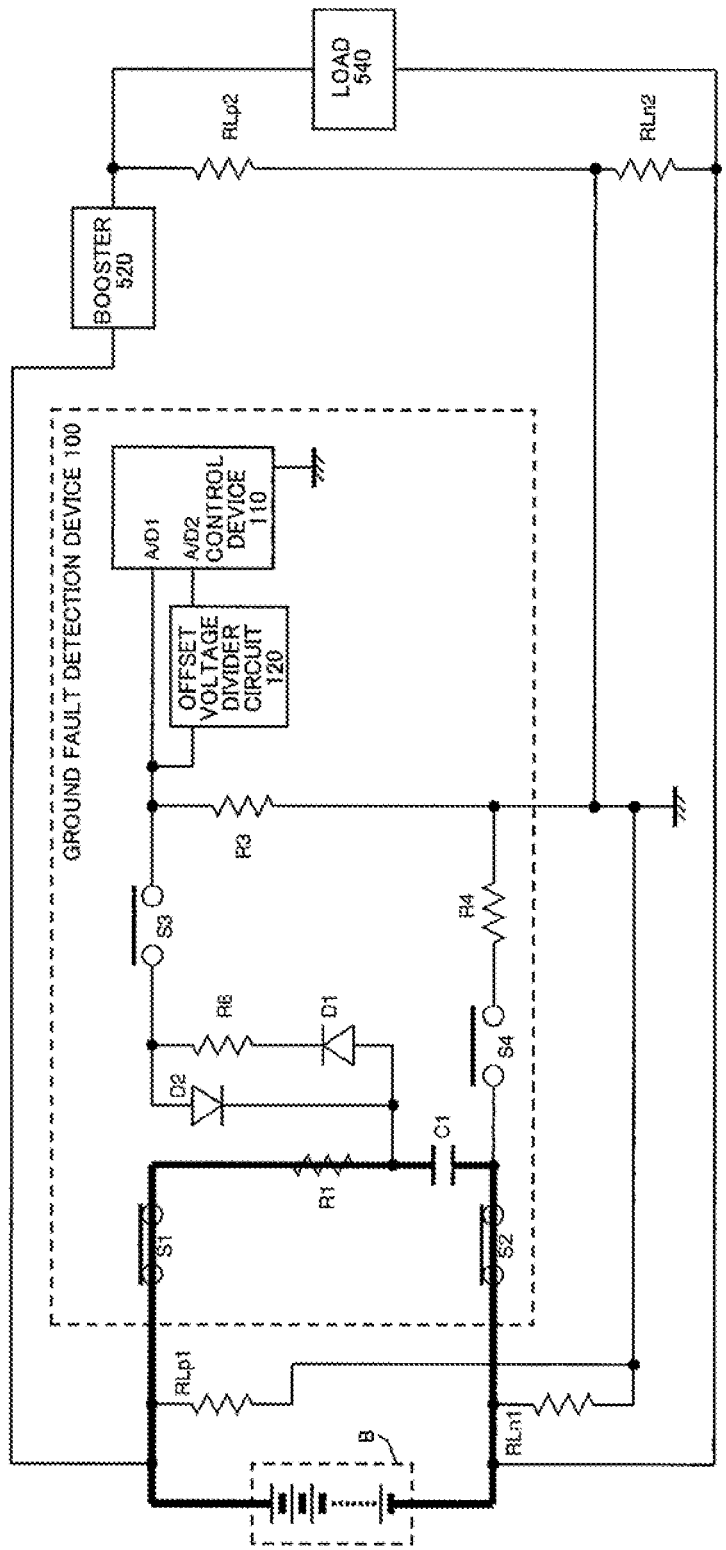
FIG. 4 is a diagram illustrating a V0 charging path.

In the V0 measurement period (step S201, step S203), the voltage V0 corresponding to the battery B voltage is measured. Therefore, the switch S1 and the switch S2 are turned on, and the switch S3 and the switch S4 are turned off to charge the voltage V0. At this time, as shown in FIG. 4, the battery B, the resistance R1, and the capacitor C1 serve as a charging path, and the capacitor C1 is charged with forward polarity.

Figure 5:
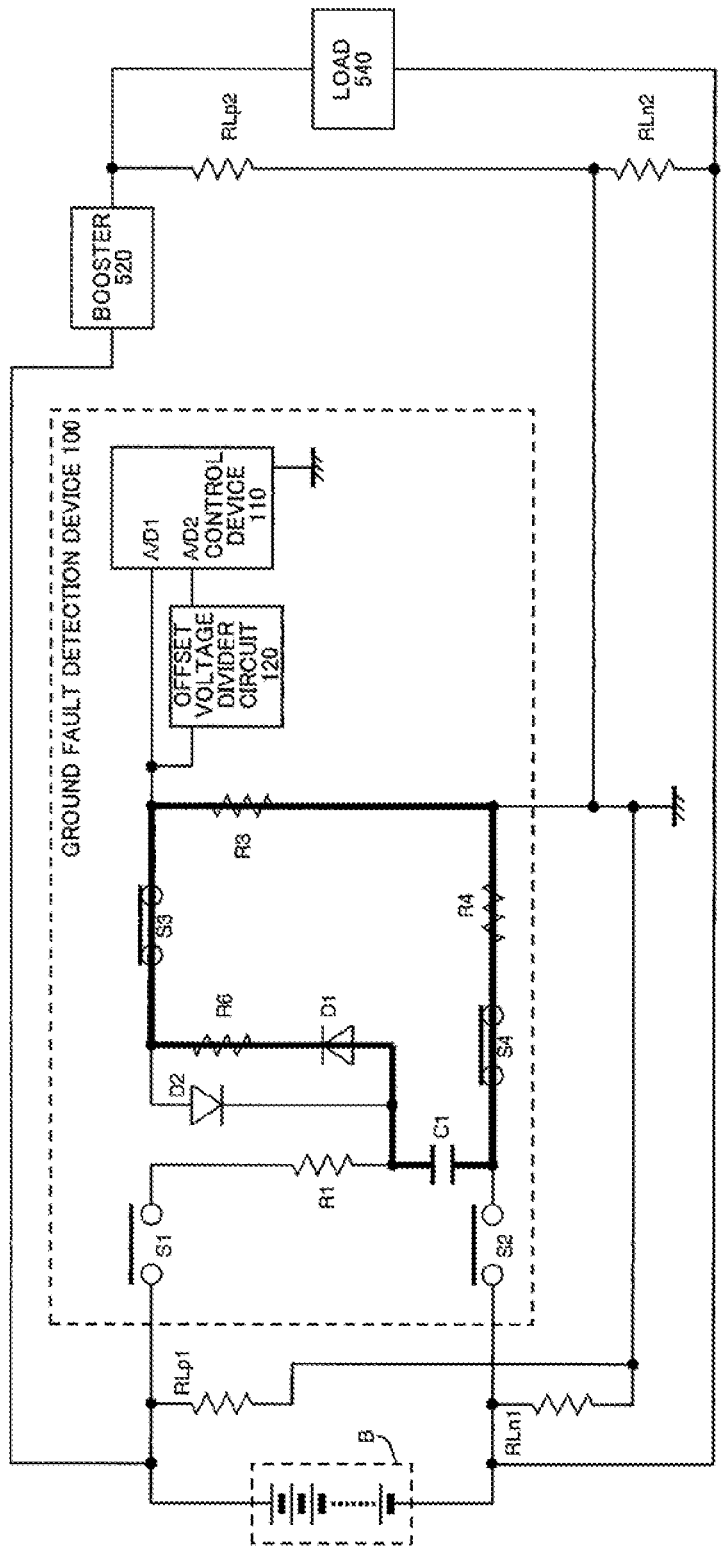
FIG. 5 is a diagram illustrating charge measurement/discharge paths.

After that, as shown in FIG. 5, the switch S1 and the switch S2 are turned off, and the switch S3 and the switch S4 are turned on. Based on the input from the first A/D port A/D1, the control device 110 measures V0. Based on the input from the second A/D port A/D2, the value V02 in which V0 is divided and offset is measured. Then, in the same circuit, the capacitor C1 is discharged for the next measurement.

Figure 6:
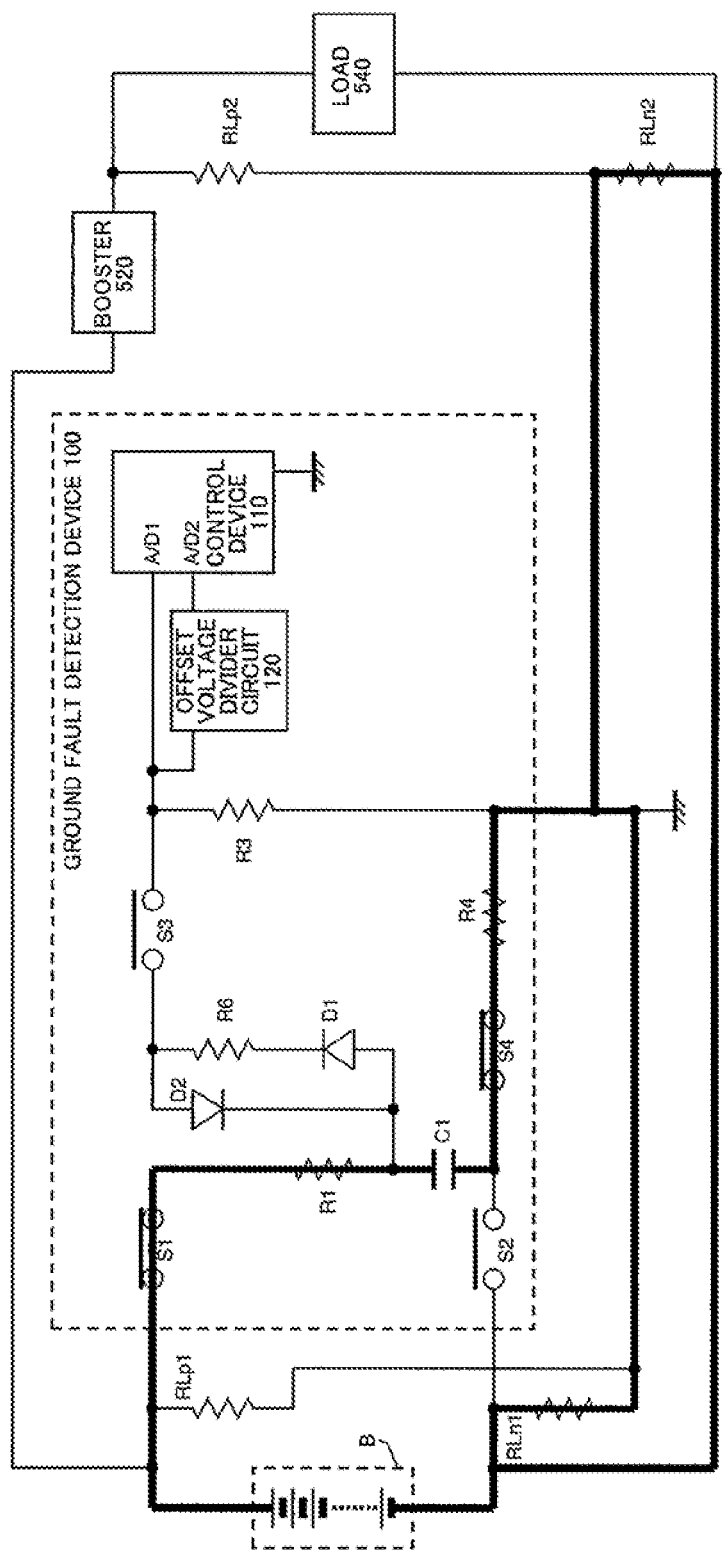
FIG. 6 is a diagram illustrating a Vcn charging path.

In the Vcn measurement period (step S202), the voltage reflecting the influence of the negative electrode side insulation resistance RLn is measured. Therefore, the switch S1 and the switch S4 are turned on, and the switch S2 and the switch S3 are turned off to charge the voltage Vcn. At this time, as shown in FIG. 6, the battery B, the resistance R1, the capacitor C1, the resistance R4, and the negative electrode side insulating resistance RLn serve as the measurement path.

After that, as shown in FIG. 5, the switch S1 and the switch S2 are turned off, and the switch S3 and the switch S4 are turned on. Based on the input from the first A/D port A/D1, the control device 110 measures Vcn. Based on the input from the second A/D port A/D2, the value Vcn2 in which Vcn is divided and offset is measured.

When the booster 520 is performing the boosting operation, a voltage obtained by dividing the boosted voltage by the positive electrode side insulating resistance RLp and the negative electrode side insulating resistance RLn is applied to the second electrode plate of the capacitor C1. When this voltage becomes larger than the voltage applied from the positive electrode side of the battery B, the capacitor C1 is charged with a polarity opposite to that of the normal due to the wraparound of the current.

When the capacitor C1 is charged with the opposite polarity, Vcn takes a negative value and becomes a value outside the measurement range of the control device 110. Therefore, when the control device 110 measures Vcn based on the input from the first A/D port A/D1, the measured value becomes 0. On the other hand, in Vcn2, as described above, Vcn is divided and offset by the offset voltage divider circuit 120, and the value is within the measurement range of the control device 110. Therefore, in the present embodiment, even if Vcn is negative, the control device 110 can measure the value Vcn2 in which Vcn is divided and offset based on the input from the second A/D port A/D2. That is, in the present embodiment, even if the capacitor C1 is charged with the opposite polarity, it is possible to measure the voltage reflecting the influence of the negative electrode side insulation resistance RLn.

Figure 7:
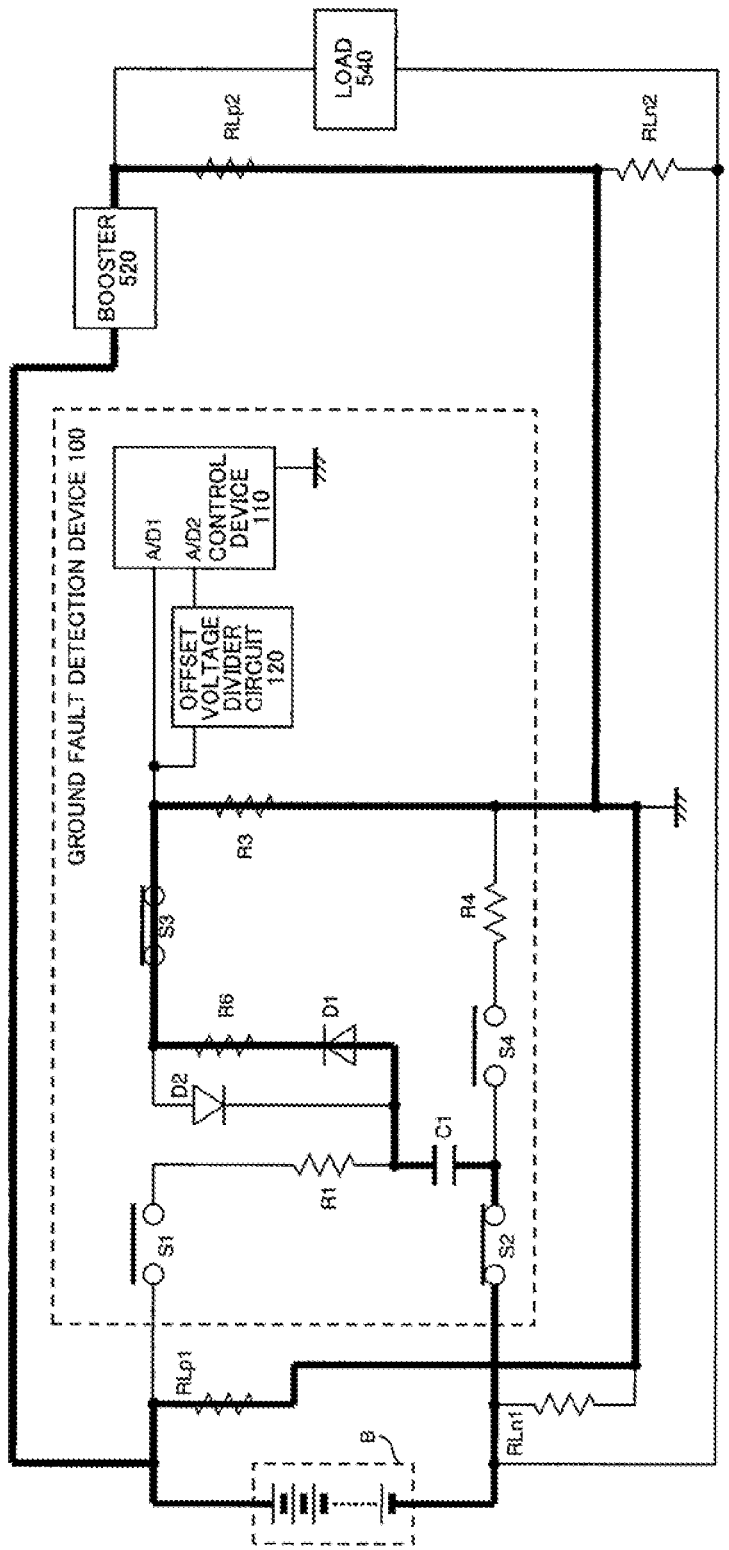
FIG. 7 is a diagram illustrating a Vcp charging path.

In the Vcp measurement period (step S204), the voltage reflecting the influence of the positive electrode side insulation resistance RLp is measured. Therefore, the switch S2 and the switch S3 are turned on, and the switch S1 and the switch S4 are turned off to charge the Vcp. At this time, as shown in FIG. 7, the battery B, the positive electrode insulation resistance RLp, the resistance R3, and the capacitor C1 serve as the charging path, and the capacitor C1 is charged with forward polarity.

After that, as shown in FIG. 5, the switch S1 and the switch S2 are turned off, and the switch S3 and the switch S4 are turned on. Based on the input from the first A/D port A/D1, the control device 110 measures Vcp. Based on the input from the second A/D port A/D2, the value Vcp2 in which Vcp is divided and offset is measured. Then, the capacitor C1 is discharged for the next measurement cycle in the same circuit.

The control device 110 determines whether or not Vcn is 0 (step S205), and when Vcn is not 0 (step S205, NO), based on V0, Vcn, Vcp obtained in the above-mentioned measurement period, the control device 110 calculates the insulation resistance RL (step S206). Then, when the insulation resistance RL becomes equal to or lower than the predetermined determination reference level (step S207, NO), it is determined that a ground fault has occurred, and an alarm is output to the external control device (step S208).

On the other hand, when Vcn is 0 (step S205, YES), the control device 110 calculates the insulation resistance RL with reference to the table data created in advance based on V02, Vcn2, and Vcp2 obtained in the above-mentioned measurement period (step S209).

In this way, in the present embodiment, when Vcn is positive, it is determined whether or not a ground fault has occurred based on the input V0, Vcn, and Vcp input from the first A/D port A/D1. When Vcn is negative, it is determined whether or not a ground fault has occurred based on V02, Vcn2, and Vcp2 input from the second A/D port A/D2. As described above, since the output from the offset voltage divider circuit 120 is always a positive value, it is possible to determine whether or not a ground fault has occurred by using only the voltage value input from the second A/D port A/D2. However, as described above, the offset voltage divider circuit 120 compresses the voltage range associated with the resistance R3. Therefore, the voltage value output from the offset voltage divider circuit 120 and input from the second A/D port A/D2 has a lower resolution than the voltage value input from the first A/D port A/D1. If the occurrence of a ground fault is detected using only the voltage value input from the second A/D port A/D2, the accuracy of detecting the ground fault may decrease. Therefore, in the present embodiment, when Vcn is positive, in order to prevent the detection accuracy of the ground fault from deteriorating, based on the input V0, Vcn, Vcp input from the first A/D port A/D1, it is designed to determine whether or not a ground fault has occurred.

In step S209, the insulation resistance RL may be calculated with reference to the table data created in advance based on V0, Vcn2, and Vcp instead of V02, Vcn2, and Vcp2. In this way, even when Vcn is negative, by using V0 and Vcp input from the first A/D port A/D1 for determining the occurrence of a ground fault, it is possible to suppress a decrease in the detection accuracy of the ground fault.

Further, in step S206, V0, Vcn, and Vcp may be calculated based on the voltage values input from the second A/D port A/D2. By using the average value of the calculated V0 and the V0 obtained in the above measurement period, the average value of the calculated Vcn and the Vcn obtained in the above-mentioned measurement period, and the average value of the calculated Vcp and the Vcp obtained in the above measurement period, the insulation resistance RL may be calculated. By doing so, it becomes possible to detect the occurrence of a ground fault while reducing the influence of noise.

Further, in the present embodiment, in order to make the voltage value input to the control device 110 positive, with the offset voltage divider circuit 120, after dividing the voltage $V_{R3}$ applied to the resistance R3 so as to be a times, the voltage is offset to a voltage ($aV_{R3}+b$) larger by a predetermined voltage b. Therefore, when the voltage $V_{R3}$ applied to the resistance R3 is 0, Vcn2 is b. Therefore, in step S205, in addition to determining whether or not Vcn is 0, it is preferable to determine whether or not Vcn2 is b or more. Then, when Vcn is 0 and Vcn2 is less than b, the insulation resistance RL may be calculated based on V02, Vcn2, and Vcp2. When Vcn is not 0 or Vcn2 is b or more, the insulation resistance RL may be calculated based on V0, Vcn, and Vcp. By doing so, even when noise is included in Vcn, it becomes possible to more accurately determine whether or not Vcn is negative.

Further, V0 (Vcn, Vcp) may be calculated based on the voltage value input from the second A/D port A/D2, and the difference between the calculated V0 (Vcn, Vcp) and the V0 (Vcn, Vcp) obtained in the above-mentioned measurement period may be compared with a predetermined threshold value. If both the first A/D port A/D1 and the second A/D port A/D2 are normal, these values should be about the same. Therefore, when the difference between these values is larger than the value expected from the variation between circuits, it is highly possible that at least one of the first A/D port A/D1 and the second A/D port A/D2 is out of order or deteriorated. Therefore, the ground fault detection device 100 may have a port failure occurrence determination unit that calculates the difference between V0 (Vcn, Vcp) calculated based on the voltage value input from the second A/D port A/D2 and V0 (Vcn, Vcp) obtained in the above measurement period, and when this difference is equal to or greater than a predetermined threshold value, determines that an abnormality has occurred in at least one of the first A/D port A/D1 and the second A/D port A/D2. After that, it may be checked which of the first A/D port A/D1 and the second A/D port A/D2 has an abnormality, and the port where the abnormality has not occurred may be used.

<Offset Voltage Divider Circuit 120>

Figure 8:
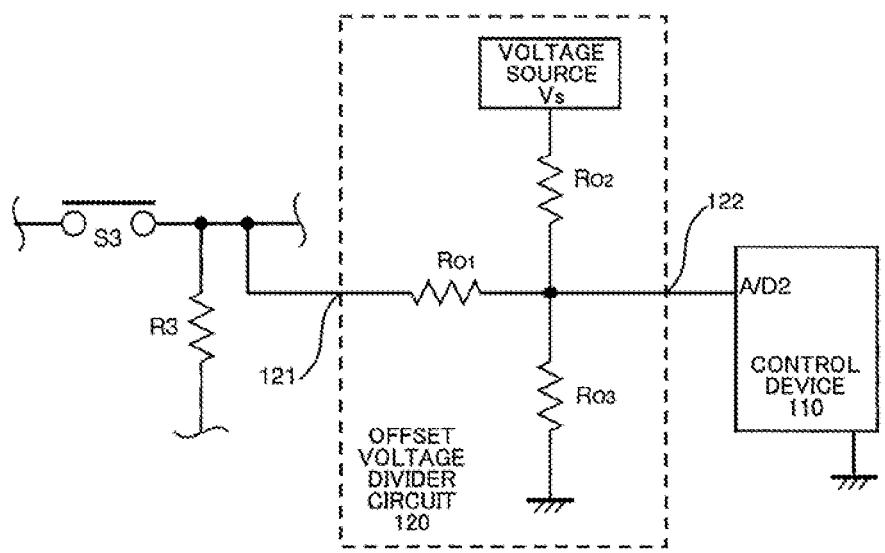
FIG. 8 is a block diagram showing a configuration example of an offset voltage divider circuit of the present embodiment.

FIG. 8 is a block diagram showing a configuration example of the offset voltage divider circuit 120 of the present embodiment. The offset voltage divider circuit 120 includes an input terminal 121 connected to a line connecting the switch S3 and the resistance R3. supplies a constant voltage of an input terminal 121 connected to a line connecting the switch S3 and the resistance R3, an output terminal 122 connected to the control device 110, three resistances $R_{O1}$, $R_{O2}$, and $R_{O3}$, and a voltage source $V_S$ that supplies a constant voltage. One end of the resistance $R_{O1}$ is connected to the input terminal 121, and the other end of the resistance $R_{O1}$ is connected to the output terminal 122. One end of the resistance $R_{O2}$ is connected to the voltage source $V_S$, and the other end of the resistance $R_{O2}$ is connected to the wire connecting the resistance $R_{O1}$ and the output terminal 122. One end of the resistance $R_{O3}$ is grounded, and the other end of the resistance $R_{O3}$ is connected to a wire connecting the resistance $R_{O1}$ and the output terminal 122. In this circuit, the voltage $V_{RO3}$ applied to the resistance $R_{O3}$ is output from the output terminal 122 and measured by the control device 110.

In this circuit, the voltage $V_{RO3}$ applied to the resistance R03 can be obtained by the following equation.

$$V_{RO3} = \frac{V_{R3}}{\left\{\frac{(R_{O2}+R_{O3})R_{O1}}{R_{O2}R_{O3}}+1\right\}} + \frac{V_S}{\left\{\frac{(R_{O1}+R_{O3})R_{O2}}{R_{O1}R_{O3}}+1\right\}}$$

Therefore, in this circuit, when the upper limit value of the voltage that can be measured by the control device 110 is Vcmax, if the values of the three resistances $R_{O1}$, $R_{O2}$, and Rn and the voltage source $V_S$ that supplies a constant voltage are set so that $0 \leq VR_{O3} \leq Vcmax$, even if the capacitor C1 is charged with the opposite polarity to the normal one, the voltage can be measured by the control device 110.

For example, when R6/R3=99, when the voltage stored in the capacitor C1 changes between −500V and 500V, the voltage applied to the resistance R3 changes between −5V and 5V. Therefore, assuming that the offset voltage divider circuit 120 of the present embodiment does not exist and the control device 110 directly measures the voltage applied to the resistance R3, when the value of the voltage stored in the capacitor C1 is between −500V and 0V, the voltage measured by the control device 110 becomes 0 as shown by the dotted line in FIG. 7. Thus, the voltage applied to the resistance R3 cannot be accurately measured by the control device 110.

Figure 9:
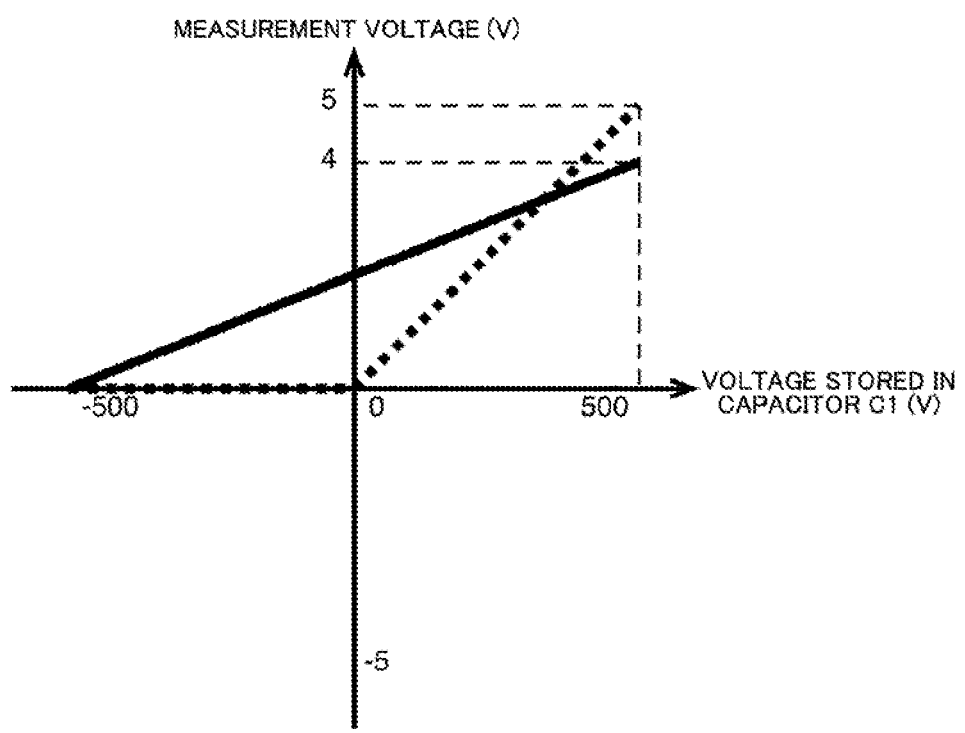
FIG. 9 is a diagram showing a relationship between the voltage stored in the flying capacitor and the measurement voltage in the present embodiment.

On the other hand, in the present embodiment, for example, when $R_{O1}=R_{O2}=R_{O3}/2$ and $V_S=5V$, the voltage $V_{RO3}$ applied to the resistance $R_{O3}$ is (⅖) ($V_{R3}+5$). Therefore, when the voltage stored in the capacitor C1 is in the range of −500V to 500V and the voltage applied to the resistance R3 is between −5V and 5V, the voltage $V_{RO3}$ applied to the resistance $R_{O3}$ is between 0V to 4V. That is, in the present embodiment, even if the voltage stored in the capacitor C1 is negative, the voltage $V_{RO3}$ applied to the resistance $R_{O1}$ is not negative, but positive and becomes 5V or less. Therefore, as shown by the solid line in FIG. 9, in the present embodiment, the control device 110 can accurately measure the voltage even when the value of the voltage stored in the capacitor C1 is between −500V and 0V. That is, in the present embodiment, even if the capacitor C1 is charged with a polarity opposite to that of the normal one, the voltage can be measured by the control device 110. That is, in the present embodiment, it is possible to measure the charging voltage regardless of the charging direction of the flying capacitor.

Further, at this time, the resistance $R_{O3}$ may be composed of two resistances $R_{O32}$ and $R_{O32}$ having the same resistance value connected in series. At this time, $R_{O1}=R_{O2}=R_{O32}=R_{O32}$, and it becomes possible to configure an offset voltage divider circuit with four resistances having the same resistance value. As a result, it becomes possible to configure the offset voltage divider circuit 120 with high accuracy.

Incidentally, the offset voltage divider circuit 120 shown in FIG. 8 is an example, and may have another circuit configuration. For example, the voltage at the input terminal may be divided by two resistances and offset by using an adder circuit composed of an operational amplifier or the like.

By connecting the resistance $R_{O2}$ to the wire connecting the resistance RO1 and the output terminal 122 via the switch, connecting the resistance $R_{O3}$ to the wire connecting the resistance $R_{O1}$ and the output terminal 122 via the switch, and turning off these switches, it is possible to input the voltage value corresponding to the voltage value input from the first A/D port A/D1 from the second A/D port A/D2. That is, it is possible to detect the ground fault by the same method as described above without providing the first A/D port A/D1. However, the incoming noise is different between the voltage value affected by the offset voltage divider circuit 120 by turning on the switch, and the voltage value that is not affected by the offset voltage divider circuit 120 by turning off the switch. Therefore, the present embodiment is provided with two A/D ports. In the present embodiment, two A/D ports, a first A/D port A/D1 and a second A/D port A/D2 are provided. Therefore, it is possible to receive the voltage value affected by the offset voltage divider circuit 120 and the voltage value not affected by the offset voltage divider circuit 120 with different A/D ports. For example, as shown in FIG. 2, it becomes possible to insert filters F1 and F2 suitable for each voltage value.

<Switching Unit>

Figure 10:
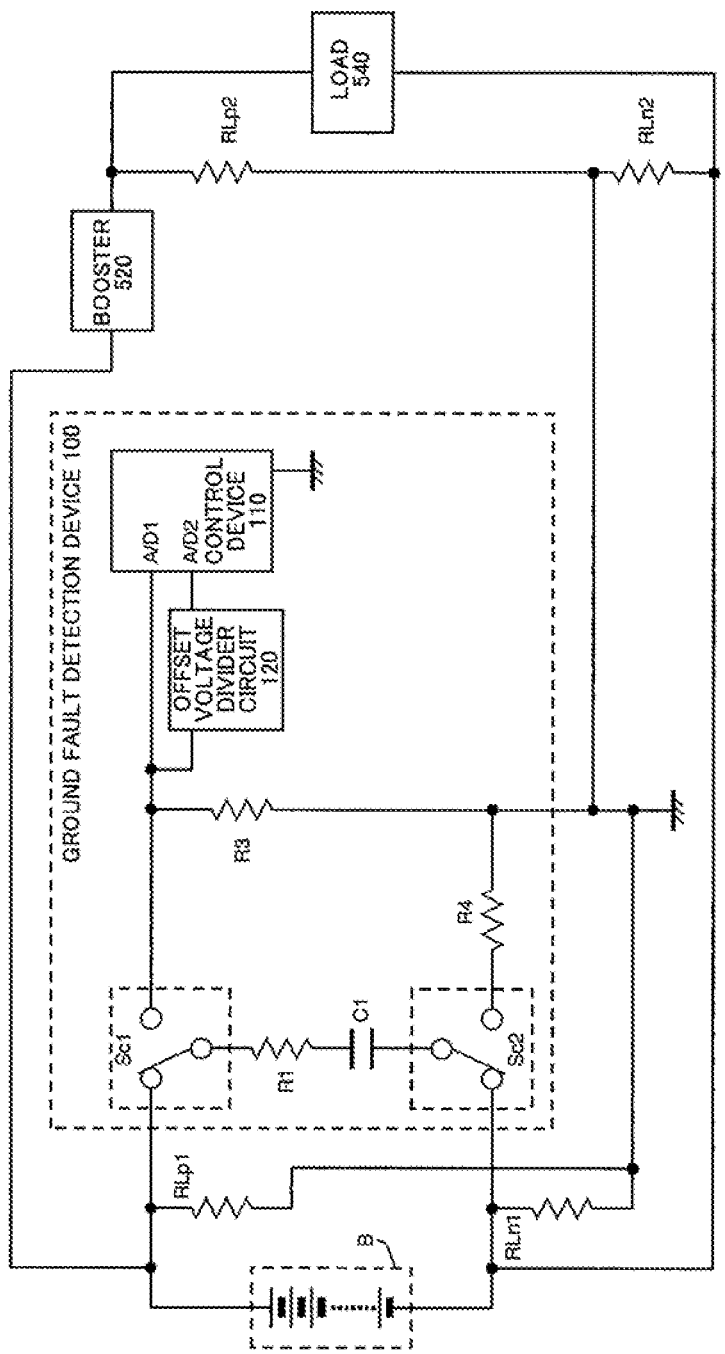
FIG. 10 is a block diagram showing another configuration of the ground fault detection device of the present embodiment.
Figure 11:
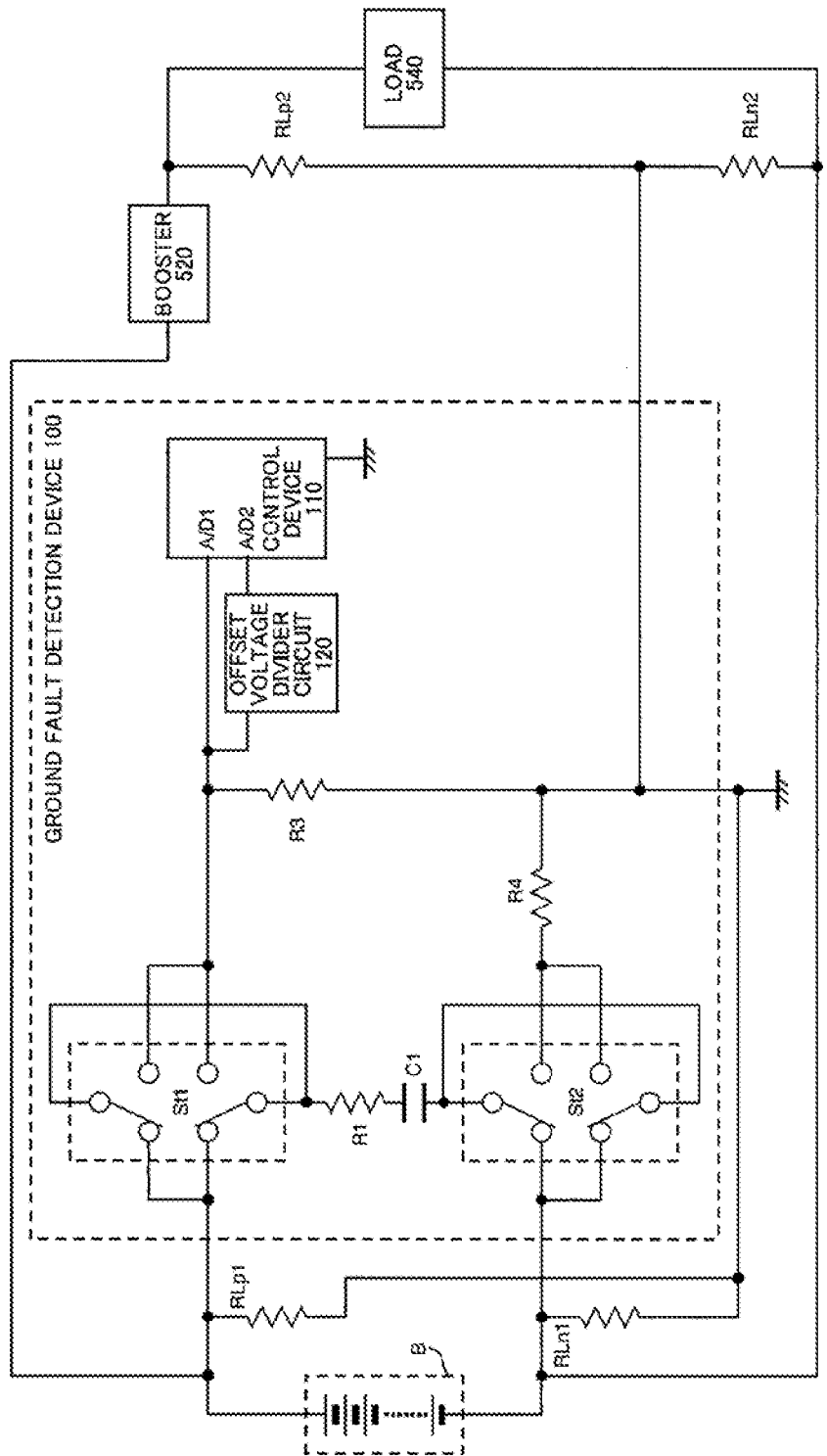
FIG. 11 is a block diagram showing another configuration of the ground fault detection device of the present embodiment.
Figure 12:
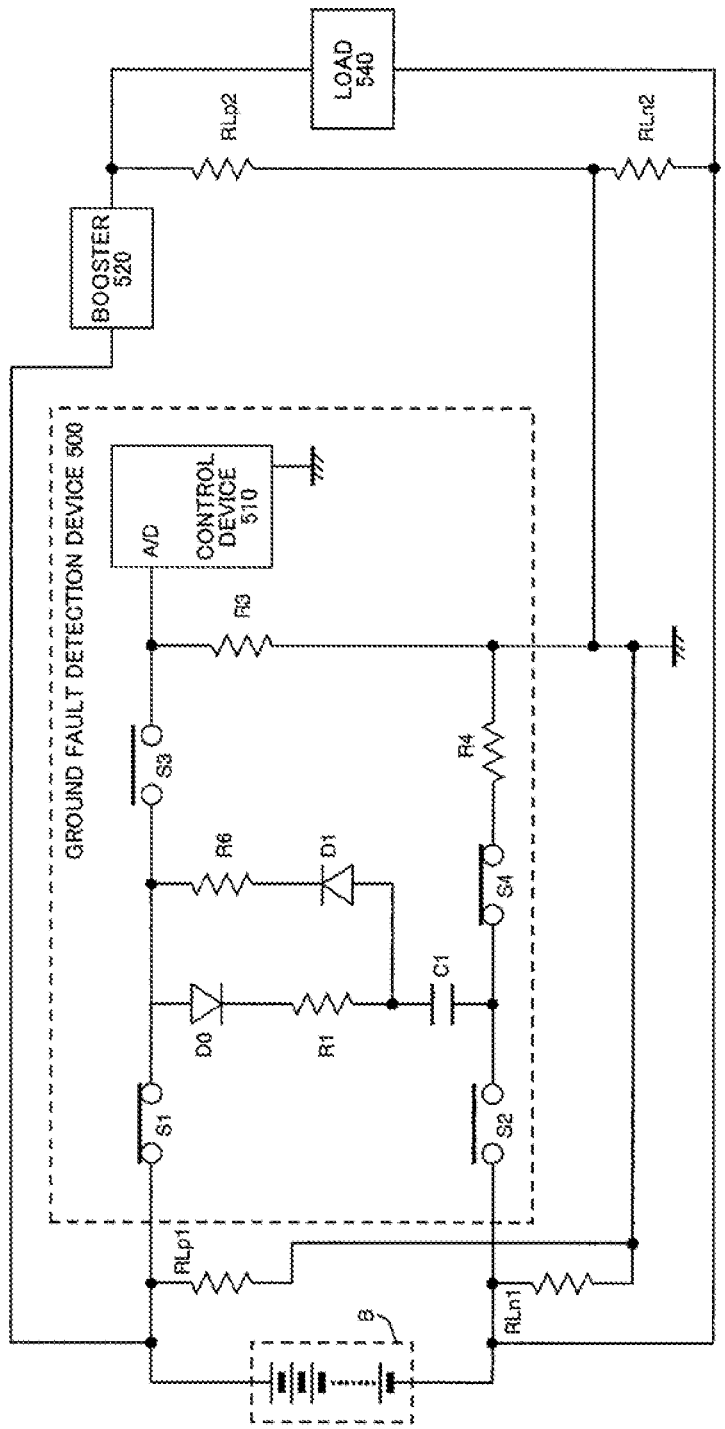
FIG. 12 is a block diagram showing a configuration example of a conventional ground fault detection device of a flying capacitor system.
Figure 13:
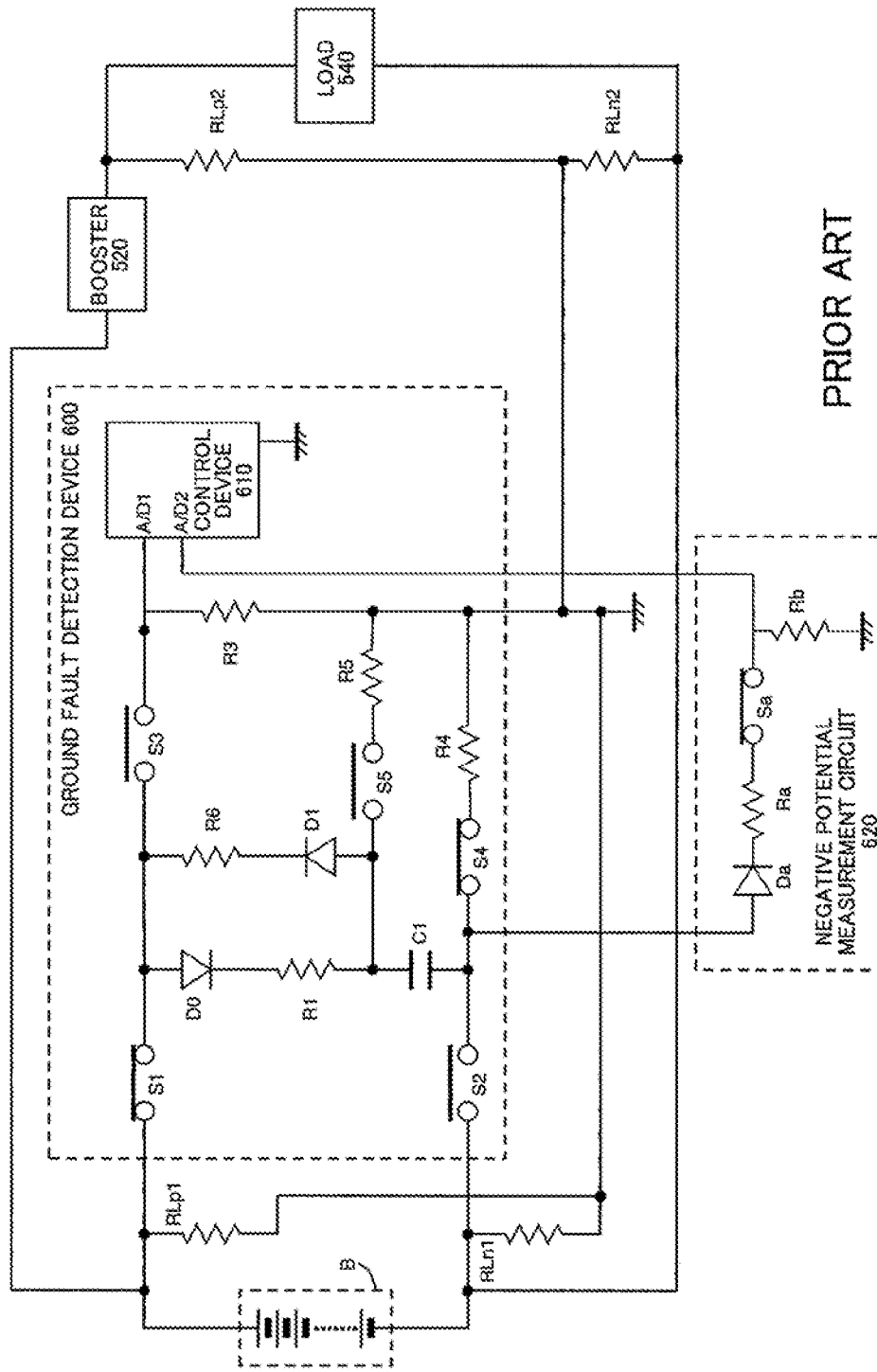
FIG. 13 is a block diagram showing a conventional configuration that enables measurement of a charging voltage even when a flying capacitor is charged with a reverse polarity.

In the present embodiment, either switch S1 or switch S3 is always on. Also, both switches cannot be turned on at the same time. Therefore, the switch S1 and the switch S3 form a switching unit switching a state in which the positive electrode side of the battery B and the positive electrode side end of the capacitor C1 are connected in series, and a state in which the positive electrode side end of the capacitor C1 is connected to ground. As shown in FIG. 10, this switching unit may be configured by a C contact switch Sc1 instead of the switch S1 and the switch S2. Further, as shown in FIG. 11, it may be configured by a twin relay St1 composed of two C contact switches that operate in conjunction with each other.

Similarly, in the present embodiment, either switch S2 or switch S4 is always on. Also, both switches cannot be turned on at the same time. Therefore, the switch S2 and the switch S4 form a switching unit switching a state in which the negative electrode side of the battery B and the negative electrode side end of the capacitor C1 are connected in series, and a state in which the negative electrode side end of the capacitor C1 is connected to ground. This switching unit may be configured by a C contact switch Sc2 as shown in FIG. 10 instead of the switch S1 and the switch S2. Further, as shown in FIG. 11, the twin relay St2 may be used.

The present invention has been described above according to a preferred embodiment of the present invention. Here, the present invention has been described by showing specific examples. However, various modifications and changes can be made to these specific examples without departing from the spirit and scope of the present invention described in the claims.

REFERENCE SIGNS LIST

100 Ground fault detection device
110 Control device
120 Offset voltage divider circuit
520 Booster
540 Load
A/D1 First A/D port
A/D2 Second A/D port

The invention claimed is:

1. A ground fault detection device that is connected to a non-grounded battery that supplies power to a load via a booster circuit, calculates an insulation resistance of a system provided with the battery, and detects a ground fault, the ground fault detection device comprising:

a capacitor having a first electrode plate and a second electrode plate and operating as a flying capacitor;

a first switching unit for switching between a state in which a positive electrode side of the battery and the first electrode plate of the capacitor are connected in series via a resistance, and a state in which the first electrode plate of the capacitor is connected to a ground via a measurement resistance;

a second switching unit for switching between a state in which a negative electrode side of the battery and the second electrode plate of the capacitor are connected with a resistance, and a state in which the second electrode plate of the capacitor is connected to the ground via the resistance;

a control unit for controlling the first switching unit and the second switching unit; and an offset voltage divider circuit that divides and offsets a voltage generated in the measurement resistance, wherein the control unit has a first port for receiving an input of a voltage generated in the measurement resistance and a second port for receiving an input of a voltage output from the offset voltage divider circuit.

2. The ground fault detection device as claimed in claim 1, wherein by controlling the first switching unit and the second switching unit, the control unit switches among a V0 charging path including the battery and the capacitor, a Vcn charging path including the battery, a negative side insulation resistance that is an insulation resistance between the negative electrode side of the battery and the ground, and the capacitor, a Vcp charging path including the battery, a positive side insulation resistance that is an insulation resistance between the positive electrode side of the battery and the ground, and the capacitor, and a charging voltage measurement path including the capacitor and the measurement resistance, and in the charging voltage measurement path, respectively receives inputs of a voltage based on voltage V0 charged in the capacitor in the V0 charging path, a voltage based on voltage Vcn charged in the capacitor in the Vcn charging path, and a voltage based on voltage Vcp charged in the capacitor through the Vcp charging path from the first port and the second port, and when the measured value of the voltage based on the voltage Vcn received from the first port is greater than 0, calculates the insulation resistance from the measured values of the voltage based on the voltage V0, the voltage based on the voltage Vcn, and the voltage based on the voltage Vcp received from the first port.

3. The ground fault detection device as claimed in claim 1, wherein by controlling the first switching unit and the second switching unit, the control unit switches among a V0 charging path including the battery and the capacitor, a Vcn charging path including the battery, a negative side insulation resistance that is an insulation resistance between the negative electrode side of the battery and the ground, and the capacitor, a Vcp charging path including the battery, a positive side insulation resistance that is an insulation resistance between the positive electrode side of the battery and the ground, and the capacitor, and a charging voltage measurement path including the capacitor and the measurement resistance, and in the charging voltage measurement path, respectively receives inputs of a voltage based on voltage V0 charged in the capacitor in the V0 charging path, a voltage based on voltage Vcn charged in the capacitor in the Vcn charging path, and a voltage based on voltage Vcp charged in the capacitor through the Vcp charging path from the first port and the second port, and when the measured value of the voltage based on the voltage Vcn received from the first port is greater than 0, calculates the insulation resistance from an average value of the voltage V0 based on the measured value at the first port and the voltage V0 based on the measured value at the second port, an average value of the voltage Vcn based on the measured value at the first port and the voltage Vcn based on the measured value at the second port, and an average value of the voltage Vcp based on the measured value at the first port and the voltage Vcp based on the measured value at the second port.

4. The ground fault detection device as claimed in claim 1,
wherein when a measured value of a voltage based on the voltage Vcn received from the first port is 0, the control unit calculates the insulation resistance from measured values of a voltage based on the voltage V0, a voltage based on the voltage Vcn, and a voltage based on the voltage Vcp received from the second port.

5. The ground fault detection device as claimed in claim 1,
wherein when a measured value of a voltage based on the voltage Vcn received from the first port is 0, the control unit calculates the insulation resistance from measured values of a voltage based on the voltage V0, and a voltage based on the voltage Vcp received from the first port, and a voltage based on the voltage Vcn received from the second port.

6. The ground fault detection device as claimed in claim 1, further comprising a port failure occurrence judgment unit for calculating at least one of a difference between voltage V0 based on the measured value at the first port and voltage V0 based on the measured value at the second port, a difference between voltage Vcn based on measurement value at the first port and voltage Vcn based on measurement value at the second port, and a difference between the voltage Vcp based on the measured value at the first port and the voltage Vcp based on the measured value at the second port, and when the calculated difference is equal to or greater than a predetermined threshold value, determines that an abnormality has occurred in at least one of the first port and the second port.

7. The ground fault detection device as claimed in claim 1,
wherein the offset voltage divider circuit has an input terminal to which the voltage generated in the measurement resistance is input, an output terminal for outputting the output voltage, a first resistance connected between the input terminal and the output terminal, a voltage source that supplies constant voltage, a second resistance having one end connected to the voltage source and another end connected to a line connecting the first resistance and the output terminal, and a third resistance whose one end is grounded and whose other end is connected to a line connecting the first resistance and the output terminal.

* * * * *